(12) United States Patent
McAlister et al.

(10) Patent No.: US 6,598,109 B1
(45) Date of Patent: Jul. 22, 2003

(54) METHOD AND APPARATUS FOR CONNECTING BETWEEN STANDARD MINI PCI COMPONENT AND NON-STANDARD MINI PCI COMPONENT BASED ON SELECTED SIGNAL LINES AND SIGNAL PINS

(75) Inventors: Lonnie D. McAlister, North Plains, OR (US); Rafael A. Maymi, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/475,490

(22) Filed: Dec. 30, 1999

(51) Int. Cl.[7] ............... G06F 13/00; G06F 13/28
(52) U.S. Cl. ............... 710/306; 710/8; 710/10; 710/11; 710/14; 710/16
(58) Field of Search ............... 710/8, 10, 11, 710/16, 14, 306

(56) References Cited

U.S. PATENT DOCUMENTS

| | | | | |
|---|---|---|---|---|
| 5,826,048 A | * | 10/1998 | Dempsey et al. | 710/306 |
| 6,148,347 A | * | 11/2000 | Finch et al. | 710/14 |
| 6,311,247 B1 | * | 10/2001 | Spencer | 710/307 |
| 6,334,793 B1 | * | 1/2002 | Amoni et al. | 439/639 |
| 6,345,330 B2 | * | 2/2002 | Chu | 710/65 |
| 6,404,393 B1 | * | 6/2002 | Nelson et al. | 343/702 |
| 6,404,626 B1 | * | 6/2002 | Low et al. | 361/686 |

* cited by examiner

Primary Examiner—Jeffrey Gaffin
Assistant Examiner—Tammara Peyton
(74) Attorney, Agent, or Firm—Blakely, Sokoloff, Taylor & Zafman LLP

(57) ABSTRACT

A method for utilizing a non standard component via a multipurpose interface includes operating a signal bus having a set of signals lines in accordance with a bus protocol and operating a component having an interface including a first set of signal pins in accordance with an interface definition. The method further includes removably accepting a selected one of a first device designed to operate with the signal bus in accordance with the bus protocol and a second device designed to operate with the component through the interface in accordance with an interface definition. The connector includes a second set of pins. The second pins of the connector are coupled to a select one of the signal lines of the signal bus and the first pins of the interface of the component based, at least in part, on the signal state of a first one of said second set of pins.

16 Claims, 4 Drawing Sheets

METHOD AND APPARATUS FOR CONNECTING BETWEEN STANDARD MINI PCI COMPONENT AND NON-STANDARD MINI PCI COMPONENT BASED ON SELECTED SIGNAL LINES AND SIGNAL PINS

FIELD OF INVENTION

The present invention relates to computer systems. More particularly, the present invention relates to interfacing computer system components via a multipurpose interface.

BACKGROUND OF THE INVENTION

In prior art computer systems, components in cards for connecting to the computer systems followed certain specifications so as to allow a standard connector. However, as a need for different components increased, a difficulty arose in trying to maintain the standard connection but still provide different components. As computer systems decrease in physical size, the need to have the ability to have removable components increased, and therefore, the Mini Peripheral Component Interconnect (Mini PCI) was designed to allow for small component cards that can be connected to slots in a computer system.

The Mini PCI connector still maintained the principle of standardization of the connection. However, the need for differing components did not decrease, and instead, increased due to smaller form factors of the computer systems.

Prior art computer systems using the Mini PCI connectors would have to place on the circuit board a different connector to utilize nonstandard Mini PCI components. The circuit board will be increased in space due to the different connector. From a manufacturer's stand point, there is reduced space due to different types of connectors on one circuit board to provide the flexibility of utilizing nonstandard components. Furthermore, the decreasing size computer systems make it not practical for a computer system to contain more circuitry than necessary for flexibility especially in mobile computer systems.

What is needed is a method and apparatus for providing the flexibility of utilizing standard and nonstandard components by connecting to a standard connector.

SUMMARY OF THE INVENTION

A method for utilizing a non standard component via a multipurpose interface includes operating a signal bus having a set of signals lines in accordance with a bus protocol and operating a component having an interface including a first set of signal pins in accordance with an interface definition. The method further includes removably accepting a selected one of a first device designed to operate with the signal bus in accordance with the bus protocol and a second device designed to operate with the component through the interface in accordance with an interface definition. The connector includes a second set of pins. The second pins of the connector are coupled to a select one of the signal lines of the signal bus and the first pins of the interface of the component based, at least in part, on the signal state of a first one of said second set of pins.

BRIEF DESCRIPTION OF THE DRAWINGS

The present invention is illustrated by way of example, and not by way of limitation, in figures of the accompanying drawings in which like reference numerals refer to similar elements.

DETAILED DESCRIPTION

A method and apparatus for interfacing a component via a multipurpose interface is described. For ease of understanding, the description will be presented in the context of interfacing a Platform LAN Connect (PLC) via a multipurpose Mini Peripheral Component Interconnect (Mini PCI) connector. However, those skilled in the art will appreciate the present invention may be practiced with other non-standard components as well as other multipurpose interfaces. Numerous specific details are set forth in order to provide a thorough understanding of the present invention. However, those skilled in the art will also understand that the present invention may be practiced without these specific details, that the present invention is not limited to the depicted embodiments, and that the present invention may be practiced in a variety of alternate embodiments. In other instances, well known methods, procedures, components, and circuits have not been described in detail. In addition, signal names identified in this detailed description are not intended to convey the active state of a given signal (active high or active low) but are simply used to name interface signals for discussion.

Briefly, the present invention provides a method that detects the presence of a non-standard component included in a standard form-factor component card inserted into a standard connector interface and multiplexing the standard electrical interface to different peripheral components, such as the board counterparts of the non-standard component.

Figure 1:
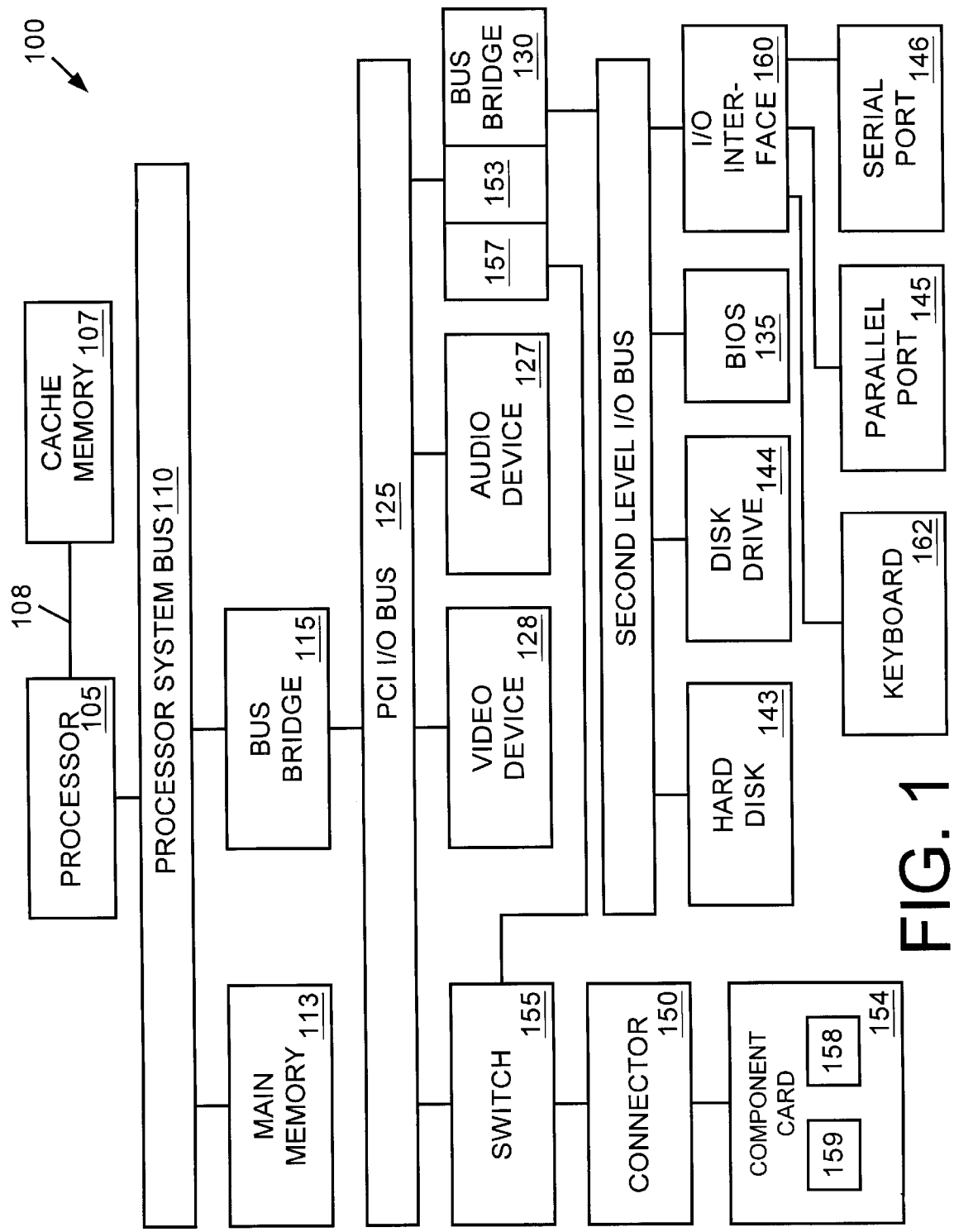
FIG. 1 is one embodiment of a computer system.

FIG. 1 illustrates a computer system 100 upon which an embodiment of the present invention can be implemented. The computer system is illustrated so as to highlight the hierarchical bus organization of the computer system. The computer system 100 includes a processor 105 that processes data signals. The processor 105 may be a complex instruction set computer (CISC) microprocessor, a reduced instruction set computing (RISC) microprocessor, a very long instruction word (VLIW) microprocessor, a processor implementing a combination of instruction sets, or other processor device. FIG. 1 shows an example of the present invention implemented on a single processor computer system 100. However, it is understood that the present invention may be implemented in a computer system having multiple processors.

Processor 105 may include first level (L1) cache memory. In one embodiment, processor 105 is also coupled to cache memory 107, which is a second level (L2) cache memory, via dedicated cache bus 108. The L1 and L2 cache memories can also be integrated into a single device. Alternatively, cache memory 107 may be coupled to processor 105 by a shared bus. Cache memory 107 is optional and is not required for computer system 100.

Main memory 113 is also coupled to processor system bus 110. Main memory 113 and cache memory 107 store sequences of instructions that are executed by processor 105. In one embodiment, main memory 113 is dynamic random access memory (DRAM) device, a synchronous direct random access memory (SDRAM) device, or other memory device. The sequences of instructions executed by processor 105 may be retrieved from main memory 113, cache memory 107, or any other storage device. Additional devices may also be coupled to processor system bus 110, such as multiple processors and/or multiple main memory devices. Computer system 100 is described in terms of a single processor; however, multiple processors can be coupled to processor system bus 110.

Processor system bus 110 is coupled to first level input/output (I/O) bus 125 by bus bridge 115. In one embodiment, first level I/O bus 125 is a Peripheral Component Interconnect (PCI) standard bus; however, other bus standards may also be used. Multiple devices, such as video device 128 and audio device 127, may be coupled to first level I/O bus 125 to provide I/O functionality.

In one embodiment, switch 155 is coupled to first level I/O bus 125 and to a non-standard Mini Peripheral Component Interconnect (Mini PCI) component's Printed Circuit Board (PCB) counterpart 153 through a non-standard Mini PCI interface 157. The non-standard Mini PCI interface 157 facilitates utilization of a non-standard Mini PCI component 159. The counterpart 153 is also coupled to the bus bridge 130. In the illustrated embodiment, switch 155 is coupled to a connector 150 providing a standard Mini PCI interface between switch 155 and component card 154.

In one embodiment, component card 154 with standard Mini PCI connectors may include a non-standard Mini PCI component 157 and a standard Mini PCI component 158. Additionally, in one embodiment, component card 154 and connector 150 conform to Mini PCI standards as defined by Peripheral Component Interconnect Special Interest Group (PCI SIG); however, other card interfaces can also be used.

Bus bridge 130 couples first level I/O bus 125 to second level I/O bus 140. In one embodiment, second level I/O bus 140 is an Industry Standard Architecture (ISA) bus; however, other bus standards may also be used, for example Extended Industry Standard Architecture (EISA). Multiple devices, such as hard disk 143 and disk drive 144 may be coupled to second level I/O bus 140. External interfaces, such as parallel port 145, and serial port 146 and keyboard 162 may also be coupled to second level I/O bus 140 through I/O interface 160. Other devices, such as cursor control devices (not shown in FIG. 1), may be coupled to I/O interface 160, or an alternative bus.

In one embodiment, BIOS 135 is coupled to second level I/O bus 140. BIOS 135 provides the lowest level interface between processor 105 and components of computer system 100. BIOS use and development are know in the art and are not described in greater detail.

One aspect of the present invention is to provide a mechanism for utilizing component cards that do not necessarily incorporate standard Mini PCI components, but still insert into a standard Mini PCI connector and will work with any other Mini PCI component cards. This is effected by recognizing that during normal computer system operation, certain pins in the Mini PCI specification are not utilized.

Figure 2:
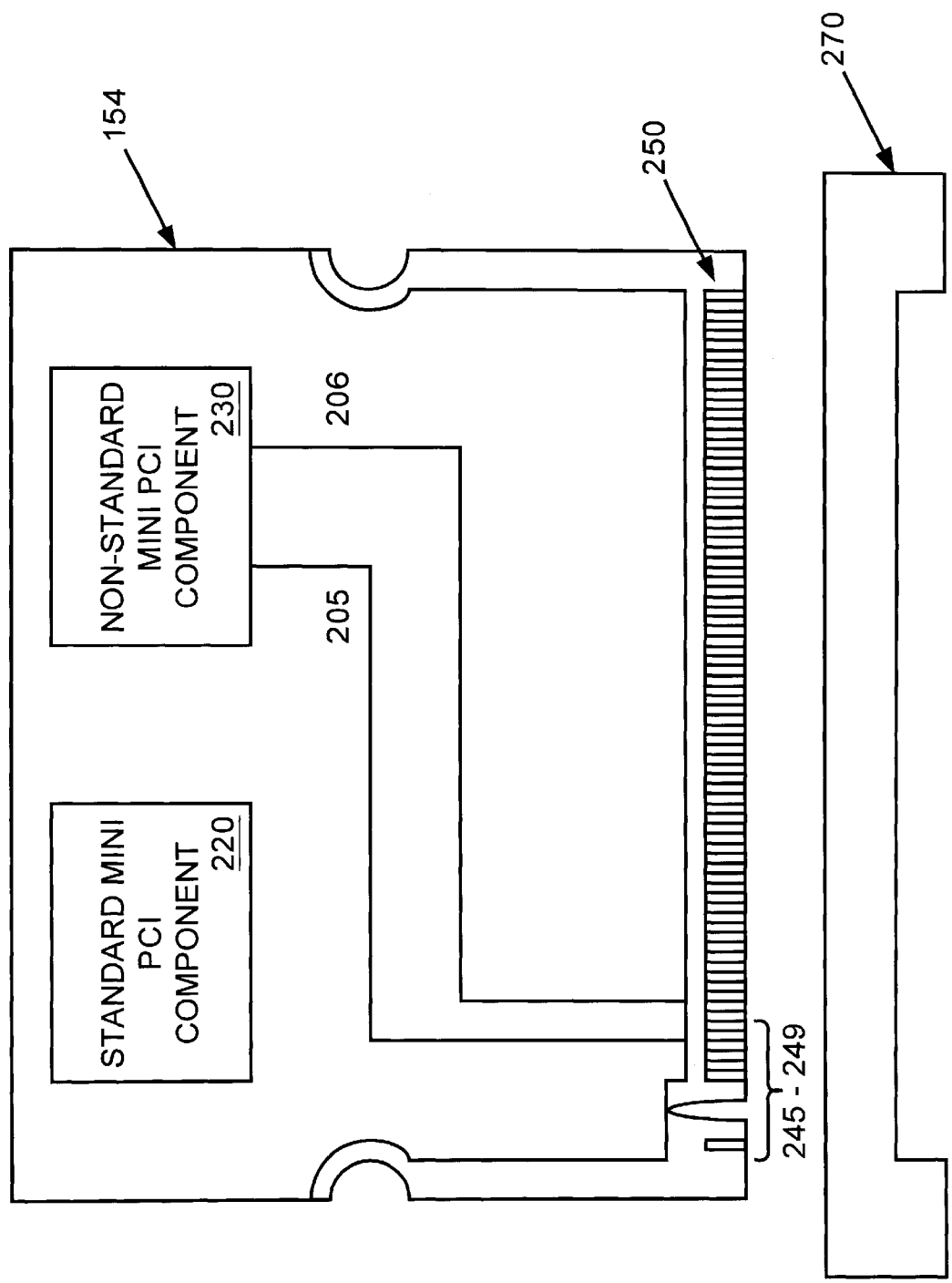
FIG. 2 is an illustration of one embodiment of a Mini PCI component card with components and the circuitry for interfacing.

FIG. 2 illustrates one embodiment of a Mini PCI component card 154. The Mini PCI component card illustrated is of a Type IIIB form factor; however, it should be understood that the Mini PCI component card 154 can be of any type so long as the type is that is of Mini PCI compliant for connecting to a standard Mini PCI connector. Also shown in FIG. 2 is a standard Mini PCI component 158 that can include but not limited to a modem 220. The Mini PCI card 154 of one embodiment, shown in FIG. 2, also includes a non-standard Mini PCI component 159 that can include but not limited to a Platform LAN Connect (PLC) 230.

The one embodiment of a Mini PCI component card 154 (shown in FIG. 1) includes a number of connecting pins 250 for insertion into a standard Mini PCI connector slot 270. Within the connecting pins 250 are several pins 245–249. In one embodiment, the pins 245–249 can be redefined as output source of magnetics to the ethernet, LAN interface pins, or any other type of reserved or unutilized pins known in the art. Also shown in FIG. 2 is an illustration of signal lines 205 and 206 coupling the non-standard Mini PCI component 230 and the pins 245–249 included in the Mini PCI component card 154. In the illustrated embodiment, signal lines 205 and 206 are shown; however, it is understood that any form of connection between components and connecting pins in Mini PCI component card known in the art may be used.

The non-standard Mini PCI component 230 sends signals on signal lines 205 and 206 to utilize re-definable pins 245–249 for facilitating a connection to the PCB counterpart 153 through the switch 155 and the non-standard Mini PCI interface 157 (shown in FIG. 1).

Figure 3:
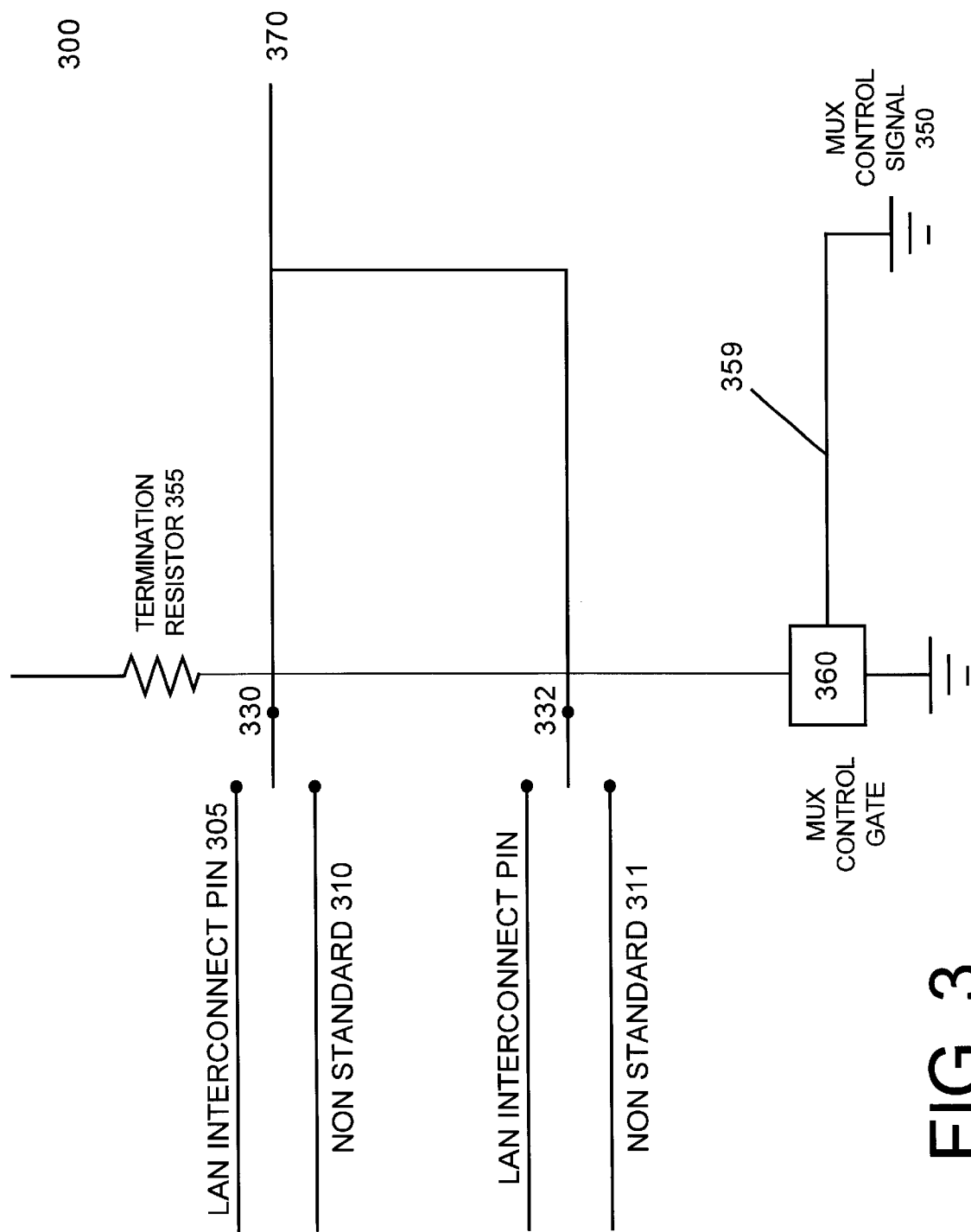
FIG. 3 is a gate level circuit diagram of one embodiment of the circuitry that allows a computer system motherboard to operate with a nonstandard component in a standard Mini PCI-compliant component card present in a Mini PCI-compliant connector slot.

FIG. 3 illustrates a gate level circuit diagram of one embodiment of the switch 155 (shown in FIG. 1) as circuit 300 that allows a computer system motherboard to operate with a nonstandard component in a standard Mini PCI component card 154 present in a standard Mini PCI connector slot 270 (shown in FIG. 2). There is shown in FIG. 3, a circuit 300 coupled to a standard Mini PCI connector slot 270 for receiving a non-standard Mini PCI component card or a standard Mini PCI component card equipped with pins compatible to a standard Mini PCI connector slot 270.

The recognition of a non-standard Mini PCI component card 154 in a standard Mini PCI connector slot 270 will be performed by the computer system 100 based on the circuit 300 of switch 155 shown on the motherboard. The non-standard Mini PCI component 230 included in the Mini PCI component card 154 (shown in FIG. 2) will indicate its presence to the computer system by activating a signal on the re-definable pins 245–249 via signal lines 205 and 206 (shown in FIG. 2).

In one embodiment shown in FIG. 3, the unutilized pins utilized by the present invention for the signaling are a LAN Interconnect Pin 305 and another LAN Interconnect Pin 306. The LAN Interconnect Pins 305 and 306 are also connected to the non-standard Mini PCI component 230 via signal lines 205 and 206 in the Mini PCI component card 154 (shown in FIG. 2) and can send and receive signals on the same pins as illustrated by 310 and 311.

In one embodiment of the present invention of FIG. 3, there are a number of switches (two shown) 330 and 332 that switch the connection interface, LAN Interface Pins 305 and 306 or non-standard Mini PCI component pins 310 and 311, based on the signal received by the circuit 300. The circuit 300 receives a multiplex (MUX) control signal 350 from the computer system 100. The circuit 300 also includes a MUX control gate 360, a termination resistor 355, a connection 370 to a nonstandard Mini PCI component counterpart 153 via non-standard Mini PCI interface 157 for connecting to the standard PCI bus 125 (shown in FIG. 1), and a MUX connection 359 to receive the MUX control signal from the computer system 100.

In the illustrated embodiment, during standard Mini PCI compliant operation, the MUX control signal 350 floats or is pulled high on power up which corresponds to standard Mini PCI component pin configuration where the LAN Interface pins 305 and 306 remain the LAN Interface corresponding to the default standard Mini PCI interface. The LAN Interface Pins 306 and 305 will be connected to baseboard electronics. However, if a non-standard Mini PCI component 230 (shown in FIG. 2) is included in the Mini PCI component card 154 (shown in FIG. 2), a signal from the non-standard component via signal lines 205 and 206 will send an identification signal to the MUX control signal 350 via connector 359, grounding the control signal 350. The switches 330 and 332 will be connecting non-standard Mini PCI component interface pins 310 and 311 to the non-standard Mini PCI component for facilitating a connection between the PCB counterpart 153 via non-standard Mini PCI interface 157 and the standard PCI bus.

From the above, it can be seen that when a standard Mini PCI component card, including standard Mini PCI components, is added to a standard Mini PCI connector, the connections remain as defined by the Mini PCI specification without modification. It is only when a non-standard Mini PCI component is present in a standard Mini PCI component card that the operation of the present invention occurs.

There has thus been described a mechanism for utilizing a non-standard Mini PCI component in a standard PCI component card through a standard Mini PCI connector slot in a computer system equipped with a PCI bus.

Figure 4:
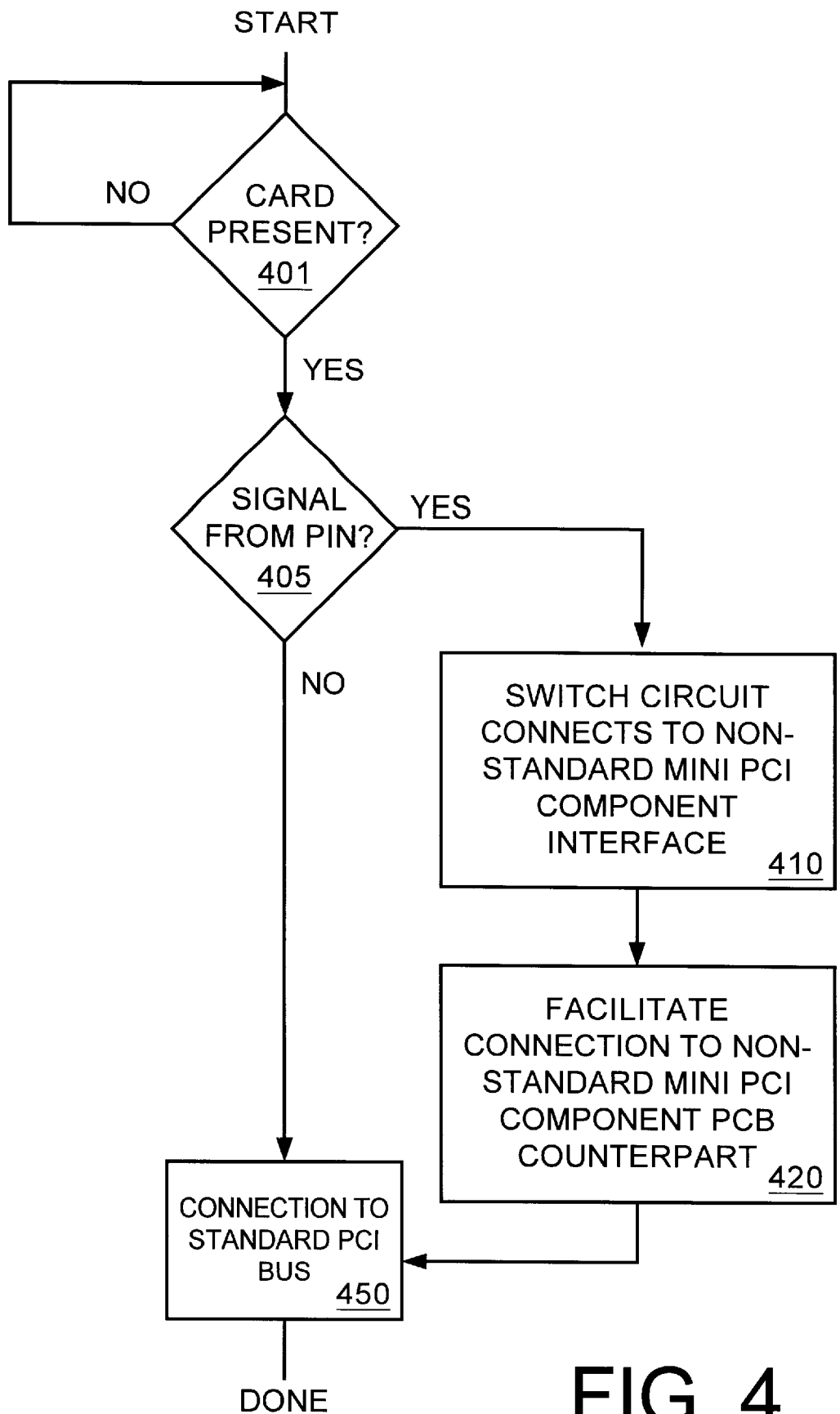
FIG. 4 is a flow diagram for utilizing nonstandard components through a standard Mini PCI connector.

FIG. 4 is a flow diagram for utilizing non-standard components through a standard Mini PCI connector. In step 401, the system waits for a card to be inserted. When a card is inserted, the system determines whether the card contains a non-standard component in step 405. This may be accomplished, for example, by receiving a signal from a re-definable pin at a switching circuit. In the illustrated embodiment, the non-standard Mini PCI component interface facilitates connection of the non-standard Mini PCI component card to the non-standard Mini PCI component counterpart on the PCB further connecting to the standard PCI bus at step 450.

In one embodiment, if the card contains a non-standard component, the card is connected to a non-standard component interface via re-definable pins in step 410. Alternatively, if the card contains a standard component, the pins are utilized or not utilized per the Mini PCI standard in step 450 and signals from the card are connected to the standard PCI bus.

Parts of the description will be presented using terminology commonly employed by those skilled in the art to convey the substance of their work to others skilled in the art.

Various operations will be described as multiple discrete steps performed in turn in a manner that is helpful in understanding the present invention. However, the order of description should not be construed as to imply that these operations are necessarily performed in the order they are presented, or even order dependent. Lastly, repeated usage of the phrase "in one embodiment" does not necessarily refer to the same embodiment, although it may.

What is claimed is:

1. A circuit board comprising:
    a signal bus having a plurality of signal lines to be operated in accordance with a bus protocol;
    a component having an interface including a first plurality of signal pins to be operated in accordance with an interface definition;
    a connector, including a second plurality of pins, to removably accept a selected one of a first device designed to operate with the signal bus in accordance with the bus protocol, and a second device designed to operate with the component through the interface in accordance with the interface definition; and
    a plurality of circuit elements to selectably couple the second pins of the connector to a selected one of the signal lines of the signal bus and the first pins of the interface of the component, based at least in part on the signal state of a first one of said second plurality of pins, wherein the circuit elements include a plurality of switching elements switchably coupled to a selected one of said signal lines and said first pins.

2. The circuit board of claim 1, wherein the signal bus comprises a peripheral component interconnect (PCI) bus.

3. A circuit board comprising:
    a signal bus having a plurality of signal lines to be operated in accordance with a bus protocol;
    a component having an interface including a first plurality of signal pins to be operated in accordance with an interface definition, wherein the component comprises a platform LAN connect (PLC);
    a connector, including a second plurality of pins, to removably accept a selected one of a first device designed to operate with the signal bus in accordance with the bus protocol, and a second device designed to operate with the component through the interface in accordance with the interface definition; and
    a plurality of circuit elements to selectably couple the second pins of the connector to a selected one of the signal lines of the signal bus and the first pins of the interface of the component, based at least in part on the signal state of a first one of said second plurality of pins.

4. The circuit board of claim 1, wherein the connector comprises a mini PCI connector.

5. The circuit board of claim 3, wherein the circuit elements comprise a plurality of switching elements switchably coupled to a selected one of said signal lines and said first pins.

6. The circuit board of claim 5, wherein the circuit elements further comprise a multiplex (MUX) control gate to control the switching elements in accordance with the signal state of said first of the second pins.

7. A method for utilizing a nonstandard component via a multipurpose interface comprising:
    operating a signal bus having a plurality of signals lines in accordance with a bus protocol;
    operating a Platform LAN Connect component having an interface including a first plurality of signal pins in accordance with an interface definition;
    removably accepting a selected one of a first device designed to operate with the signal in accordance with the bus protocol, and a second device designed to operate with the component through the interface in accordance with the interface definition at a connector, including a second plurality of pins; and
    selectably coupling the second pins of the connector to a selected one of the signal lines of the signal bus and the first pins of the interface of the component based, at least in part, on the signal state of a first one of said secondary plurality of pins, wherein selectably coupling comprises selectably coupling at a plurality of switching elements switchably coupled to a selected one of said signal lines and said first pins.

8. The method of claim 7, wherein operating the signal bus comprise operating a PCI bus.

9. A method for utilizing a nonstandard component via a multipurpose interface comprising:

operating a signal bus having a plurality of signals lines in accordance with a bus protocol;

operating a Platform LAN Connect component having an interface including a first plurality of signal pins in accordance with an interface definition;

removably accepting a selected one of a first device designed to operate with the signal in accordance with the bus protocol, and a second device designed to operate with the component through the interface in accordance with the interface definition at a connector, including a second plurality of pins; and selectably coupling the second pins of the connector to a selected one of the signal lines of the signal bus and the first pins of the interface of the component based, at least in part, on the signal state of a first one of said secondary plurality of pins.

10. The method of claim 9, wherein removably accepting comprise removably accepting at a Mini PCI connector.

11. A method for utilizing a nonstandard component via a multipurpose interface comprising:

operating a signal bus having a plurality of signals lines in accordance with a bus protocol;

operating a component having an interface including a first plurality of signal pins in accordance with an interface definition;

removably accepting a selected one of a first device designed to operate with the signal in accordance with the bus protocol, and a second device designed to operate with the component through the interface in accordance with the interface definition at a connector, including a second plurality of pins; and selectably coupling the second pins of the connector to a selected one of the signal lines of the signal bus and the first pins of the interface of the component based, at least in part, on the signal state of a first one of said secondary plurality of pins, wherein selectably coupling comprises selectably coupling at a plurality of switching elements switchably coupled to a selected one of said signal lines and said first pins.

12. The method of claim 11, further comprise controlling a multiplex (MUX) control gate to control the switching elements in accordance with the signal state of said first of the second pins.

13. A computer system comprising:

a central processing unit (PCU);

a host bus coupled to the CPU for conveying signals to and from the CPU;

an I/O bus having slots for providing a communications path between the computer system and peripheral devices, the I/O bus including a signal bus having a plurality of signal lines to be operated in accordance with a bus protocol;

a bus bridge coupled between the host bus and the I/O bus for routing transactions between said host bus and the I/O bus;

a connector coupled to the I/O bus for connecting one of the peripheral devices to the slots of the I/O bus; and a plurality of circuit elements coupled to the connector for allowing use of a peripheral device in said connector, wherein the circuit elements include a plurality of switching elements switchably coupled to a selected one of the plurality of signal lines of the signal bus.

14. The computer system of claim 13, wherein the I/O bus comprises:

a component having an interface including a first plurality of signal pins to be operated in accordance with an interface definition.

15. The computer system of claim 14, wherein the connector includes a second plurality of pins to removably accept a selected one of a first peripheral device designed to operate with the component through the interface in accordance with the interface definition.

16. The computer system of claim 15, wherein the plurality of circuit elements selectably couple the second pins of the connector to a selected one of the signal lines of the signal bus and the first pins of the interface of the component based, at least in part, on the signal state of a first one of said second plurality of pins.

* * * * *